(12) United States Patent
Suda

(10) Patent No.: US 6,717,479 B2
(45) Date of Patent: Apr. 6, 2004

(54) DELAY CIRCUIT AND RING OSCILLATOR

(75) Inventor: Masakatsu Suda, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 10/221,994

(22) PCT Filed: Apr. 6, 2001

(86) PCT No.: PCT/JP01/02985
§ 371 (c)(1),
(2), (4) Date: Sep. 18, 2002

(87) PCT Pub. No.: WO01/78234
PCT Pub. Date: Oct. 18, 2001

(65) Prior Publication Data
US 2003/0048141 A1 Mar. 13, 2003

(30) Foreign Application Priority Data
Apr. 7, 2000 (JP) ........................... 2000-106443

(51) Int. Cl.[7] .............................................. H03B 27/00
(52) U.S. Cl. ........................................... 331/57; 331/45
(58) Field of Search ..................... 331/57, 45; 327/149, 327/161

(56) References Cited

U.S. PATENT DOCUMENTS

| | | | | |
|---|---|---|---|---|
| 5,818,276 A | | 10/1998 | Garrity et al. ............... | 327/259 |
| 5,929,714 A | * | 7/1999 | Nakamura .................... | 331/57 |
| 6,166,572 A | * | 12/2000 | Yamaoka ..................... | 327/149 |

FOREIGN PATENT DOCUMENTS

| | | | | |
|---|---|---|---|---|
| DE | 28 16 577 A1 | 10/1979 | .......... | H03K/3/295 |
| JP | 56-107630 | 8/1981 | | |
| JP | 58-25710 | 2/1983 | | |
| JP | 05-129911 | 5/1993 | | |

OTHER PUBLICATIONS

Patent Abstracts of Japan, publication No. 05–129911, publication dated May 25, 1993.
Patent Abstracts of Japan, publication No. 56–107630, publication dated Aug. 26, 1981.
Patent Abstracts of Japan, publication No. 58–025710, publication date is Feb. 16, 1983.
German Office Action dated Mar. 6, 2003, 4 pages, with Translation, 5 pages.
English Language Translation of International Preliminary Examination Report dated May 24, 2002, for PCT/JP01/02985 (5 pages).

* cited by examiner

*Primary Examiner*—Robert Pascal
*Assistant Examiner*—Joseph Chang
(74) *Attorney, Agent, or Firm*—Rosenthal & Osha L.L.P.

(57) ABSTRACT

A variable delay circuit of this invention includes delay paths, connection paths, and a NAND circuit 146 which takes output of the delay paths and performs logical NAND operation. The delay paths are connected in parallel to an input terminal. The connection path connects electrically an output of a delay element in the first delay path, and an input of a delay element in the second delay path. The connection path connects electrically an output of the delay element, and an input of the delay element. An additional element is positioned at an input of a predetermined delay element so that input loads of delay elements are equalized. From these configurations, there is provided the variable delay circuit which stabilizes a supply current, and generates an accurate delay in a small-sized circuit.

17 Claims, 15 Drawing Sheets

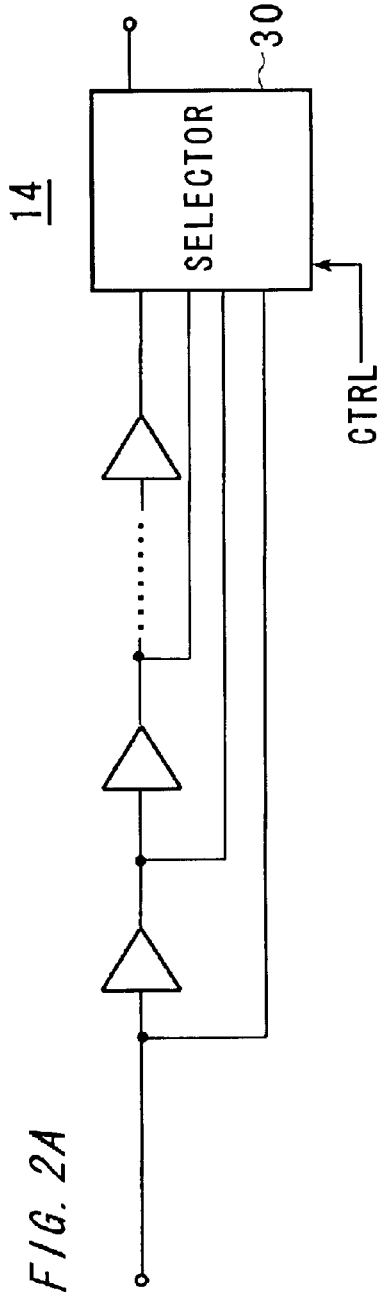
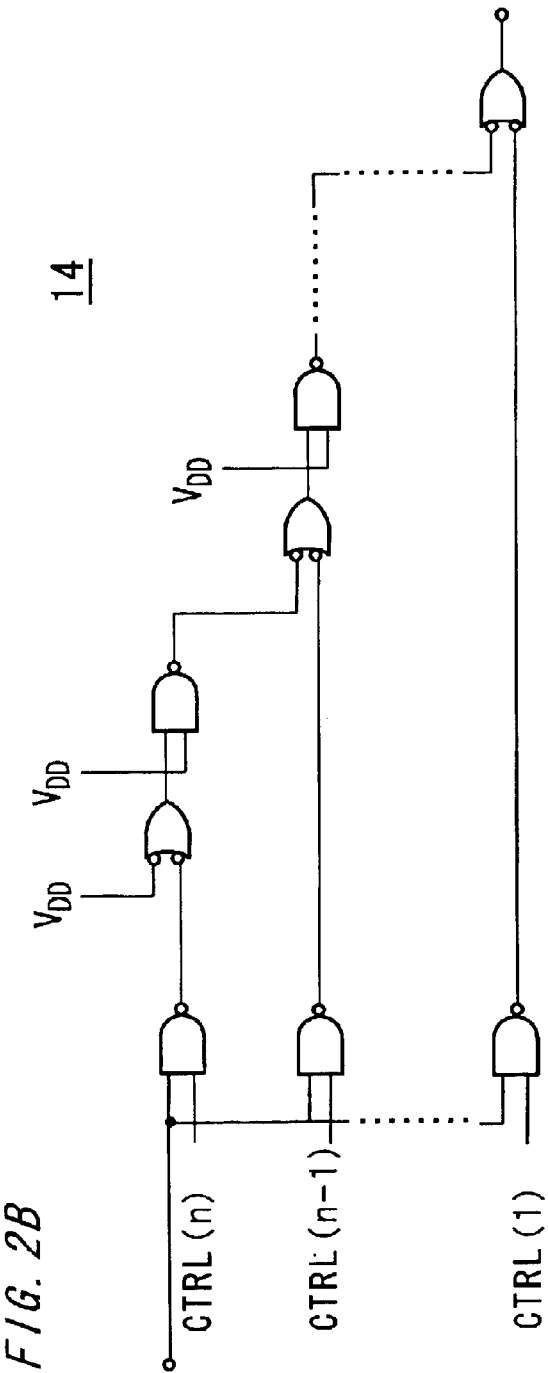
FIG. 2A
FIG. 2B

*FIG. 9*

| CONTROL SIGNAL | | | | | | DELAY SPAN | | |
|---|---|---|---|---|---|---|---|---|
| S1 | S2 | S3 | S4 | S5 | S6 | THE NUMBER OF NAND CIRCUITS | THE NUMBER OF INPUTS A1 | THE NUMBER OF INPUTS A2 |
| (1) 1 | 0 | 1 | 0 | 0 | 0 | 4 | 4 | 0 |
| (2) 0 | 1 | 0 | 0 | 1 | 0 | 4 | 1 | 3 |
| (3) 1 | 0 | 0 | 1 | 1 | 0 | 6 | 5 | 1 |
| (4) 0 | 1 | 1 | 0 | 0 | 1 | 6 | 2 | 4 |

FIG. 13

| PATH | CONTROL SIGNAL | | DELAY SPAN |
|---|---|---|---|
| | SAn·····SA2 SA1 | SBn·····SB2 SB1 SB0 | THE NUMBER OF NAND CIRCUITS |
| (1) | 0 ····· 0  0 | 0 ····· 0  0  1 | 2 |
| (2) | 0 ····· 0  1 | 0 ····· 0  1  0 | 6 |
| (3) | 0 ····· 1  1 | 0 ····· 1  0  0 | 10 |
| ⋮ | ⋮ | ⋮ | ⋮ |
| (n+1) | 1 ····· 1  1 | 1 ····· 0  0  0 | 4n+2 |

*FIG. 15*

| CONTROL SIGNAL | | | | | | DELAY SPAN | | |
|---|---|---|---|---|---|---|---|---|
| S1 | S2 | S3 | S4 | S5 | S6 | THE NUMBER OF NAND CIRCUIT | THE NUMBER OF INPUTS A1 | THE NUMBER OF INPUTS A2 |
| (1) 1 | 0 | 1 | 0 | 0 | 0 | 4 | 4 | 0 |
| (2) 0 | 1 | 0 | 0 | 1 | 0 | 4 | 0 | 4 |
| (3) 1 | 0 | 0 | 1 | 1 | 0 | 8 | 6 | 2 |
| (4) 0 | 1 | 1 | 0 | 0 | 1 | 8 | 2 | 6 |

DELAY CIRCUIT AND RING OSCILLATOR

The present application is a continuation application of PCT/JP01/02985 filed on Apr. 6, 2001, claiming priority from a Japanese patent application No. 2000-106443 filed on Apr. 7, 2000, the contents of which are incorporated herein by reference.

BACKGROUND OF THE INVENTION

1. Field of the Invention

The present invention relates to a delay circuit and a ring oscillator.

2. Description of the Related Art

FIG. 1 is a block diagram of a conventional variable delay circuit 10. The conventional variable delay circuit 10 includes an input terminal 12, a coarse delay circuit 14, a fine delay circuit 16, memories 18 and 20 which store data for controlling the coarse delay circuit 14 and the fine delay circuit 16 respectively, and an output terminal 22. The coarse delay circuit 14 generates a long span of coarse delay, and the fine delay circuit 16 generates a short span of fine delay.

FIG. 2 shows a configuration of the coarse delay circuit 14 included in the conventional variable delay circuit 10. FIG. 2A shows the coarse delay circuit 14 in which (n−1) stages of buffers are connected by cascade connection. Input of the buffer of the first stage and output of the buffers of each stage connect to a selector 30. The selector 30 selects one of n signal lines based on a supplied control signal CTRL. The coarse delay circuit 14 shown in FIG. 2A has coarse delay resolution equivalent to one buffer, i.e., resolution equivalent to two inverters.

FIG. 2B shows the coarse delay circuit 14 constituted by a plurality of NAND circuits. In this coarse delay circuit 14, an input signal diverges to n stages of paths, and is supplied to NAND circuits respectively. Control signals CTRL (1)–(n) are supplied to the NAND circuits positioned at the first stage of each path respectively. The plurality of NAND circuits are positioned at n stages of paths so that the coarse delay circuit 14 has coarse delay resolution equivalent to two NAND circuits.

FIG. 3 shows the configuration of the fine delay circuit 16 included in the conventional variable delay circuit 10. FIG. 3A shows the fine delay circuit 16 in which a plurality of capacitors, constituted from transfer gates 32 and gates 34 of transistors, connect to a signal line in parallel. Control signals are supplied to each of the transfer gates 32, and they perform on-off control independently. By varying the number of the transfer gates 32 which are turned on, a plurality of stages of capacitors are utilized as a variable capacitor. The fine delay circuit 16 generates a short fine delay by curving a rise/fall edge of a waveform using the variable capacitor.

FIG. 3B shows the fine delay circuit 16 in which a plurality of stages of transistors 36 are inserted in the power supply section of an inverter. Control signals are supplied to gates of each of the transistors 36, which perform on-off control independently. By varying the number of the gates which are turned on, the plurality of stages of transistors are utilized as a variable resistance. The fine delay circuit 16 generates a short fine delay by varying a time constant for charging a load capacitance of the inverter using this variable resistance.

Since the conventional variable delay circuit 10 shown in FIG. 1 has two stages of delay circuits in which the coarse delay circuit 14 and the fine delay circuit 16 are connected in series, a size of the circuit becomes large. Consequently, in the variable delay circuit 10, there is a problem that the variable delay circuit 10 requires a measurable amount of power, and there is a strong possibility of deteriorating an accuracy of delay span. Furthermore, there is a drawback that the coarse delay circuit 14 shown in FIG. 2A has a long offset propagation delay time (tPD). Moreover, the coarse delay circuit 14 shown in FIG. 2B and the fine delay circuit 16 shown in FIGS. 3A and B have a drawback that input loads of delay elements are not uniform.

FIG. 4 is a diagram for explaining a consumed electric current wave of a circuit in which a plurality of buffers are connected by cascade connection. FIG. 4A shows a consumed electric current wave when input loads of buffers are uniform. In this case, it is shown that the wave of the consumed electric current is flat. FIG. 4B shows a consumed electric current wave when input loads of buffer are not uniform. A circuit, in which a capacitor is positioned between some buffers, is shown as an example. When a signal is supplied to this circuit, the wave of the consumed electric current cannot be maintained to be flat since a capacitor performs charge and discharge, which causes a supply current to be fluctuated. The noise which appears in the consumed electric current wave has a bad influence on other circuits in the variable delay circuit 10, and especially this noise easily fluctuates an operating characteristic of a circuit which has long rise/fall time. For this reason, there has been a problem that it is difficult to generate a accurate delay span using the coarse delay circuit 14 shown in FIG. 2B and the fine delay circuit 16 shown in FIGS. 3A and B.

SUMMARY OF THE INVENTION

Accordingly, it is an object of the present invention to provide a delay circuit which solve the foregoing problem and a ring oscillator which includes the delay circuit. The object can be achieved by combinations described in the independent claims. The dependent claims define further advantageous and exemplary combinations of the present invention.

In order to solve the foregoing problem, the first aspect of the present invention provides a delay circuit which delays an input signal. The delay circuit includes an input terminal to which the input signal is supplied, a plurality of delay paths which have a plurality of delay elements and are connected in parallel to the input terminal, and a connection path which connects electrically an output of a delay element in a first delay path in the plurality of delay paths, and an input of a delay element in a second delay path which is different from the first delay path. This delay circuit may include a connection path which connects electrically an output of a delay element in the second delay path, and an input of a delay element in the first delay path.

The delay circuit in the first aspect may further include at least one connection path which connects electrically an output of the delay element in at least one delay path among the plurality of delay paths, and an input of the delay element in another delay path which is positioned at a following stage of the delay path, and a connection path which connects electrically an output of the delay element in a delay path of an final stage, and an input of the delay element in a delay path of a first stage. At this time, it is preferable that the plurality of connection paths connect the delay paths from the first stage to the final stage in order, and to connect the delay path of the final stage and the first stage.

The delay element may also include a logic gate circuit which has at least two inputs, a first input and a second input.

Moreover, all the delay elements may be constituted by the logic gate circuits. It is preferable that the logic gate circuit in the delay path makes either the first input or the second input to be an input to the logic gate circuit based on a desired delay span which delays the input signal. Moreover, the logic gate circuit may be a NAND circuit.

Moreover, an additional element maybe positioned at an input of the predetermined delay element so that input loads of the delay elements may be substantially equalized. It is preferable that the additional element is the same element as the delay element. When the delay element is constituted by a logic gate circuit, it is preferable that the additional element is also constituted by a logic gate circuit. Moreover, the connection path may include the delay element. Moreover, the logic gate circuit maybe a NAND circuit.

The second aspect of the present invention provides a delay circuit which delays an input signal. The delay circuit includes an input terminal to which the input signal is supplied, a delay path which has a plurality of delay elements and connects to the input terminal, and an additional element positioned at an input of the predetermined delay element so that input loads of the delay elements in the delay paths may be substantially equalized. It is preferable that the additional element is the same element as the delay element.

The third aspect of the present invention provides a ring oscillator which varies an oscillation frequency. The ring oscillator includes a delay path which has a plurality of delay elements, a feedback line which returns an output of the delay path to an input of the delay path, and an additional element positioned at an input of the predetermined delay element so that input loads of the delay elements in the delay paths may be substantially equalized. It is preferable that the additional element is the same element as the delay element. Moreover, it is preferable that the ring oscillator has the plurality of delay paths connected in parallel, and a connection path which connects electrically an output of the delay element in a first delay path among the plurality of delay paths and an input of the delay element in a second delay path which is different from the first delay path.

This summary of invention does not necessarily describe all necessary features so that the invention may also be a sub-combination of these described features.

BRIEF DESCRIPTION OF THE DRAWINGS

FIGS. 2A and 2B show a configuration of a course delay circuit 14 included in the conventional variable delay circuit 10.

FIG. 9 is a diagram for explaining the relationship between control signals S1–S6 supplied to each delay element, and a delay span of an output signal in the variable delay circuit 100 shown in FIG. 7.

FIG. 13 shows a relationship between a combination of control signals SA1–SAn and SB0–SBn which select the delay path in the variable delay circuit 210 shown in FIG. 12, and delay spans of a selected delay path.

FIG. 15 is a diagram for explaining a relationship between control signals S1–S6 supplied to each delay element, and delay spans of an output signal in the variable delay circuit 212 shown in FIG. 14.

DETAILED DESCRIPTION OF THE INVENTION

The invention will now be described based on the embodiments hereinafter, which do not intend to limit the scope of the present invention as defined in the appended claims. All of the features and the combinations thereof described in the embodiments are not necessarily essential to the invention.

Figure 1:
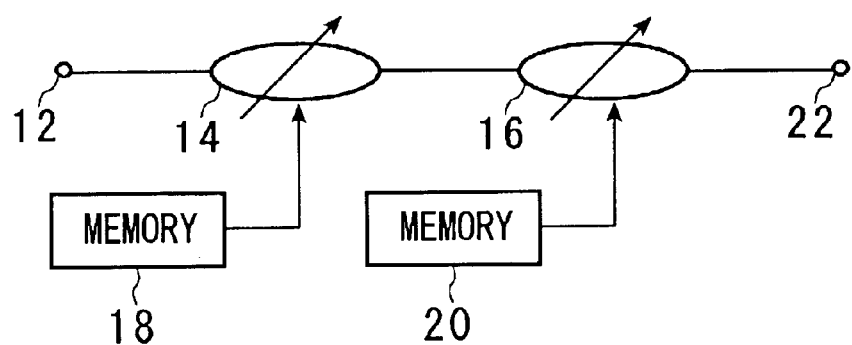
FIG. 1 is a block diagram of a conventional variable delay circuit 10.
Figure 3A:
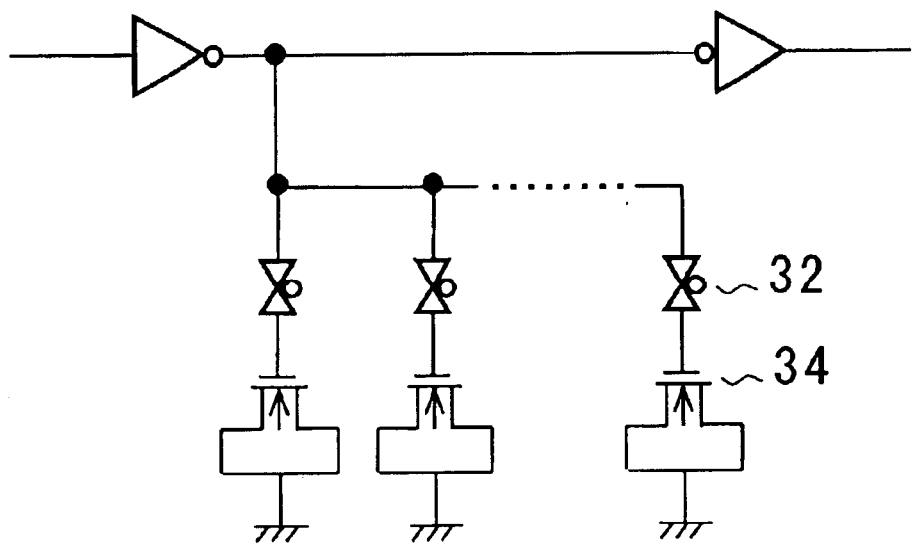
FIGS. 3A and 3B show a configuration of a fine delay circuit 16 included in the conventional variable delay circuit 10.
Figure 3B:
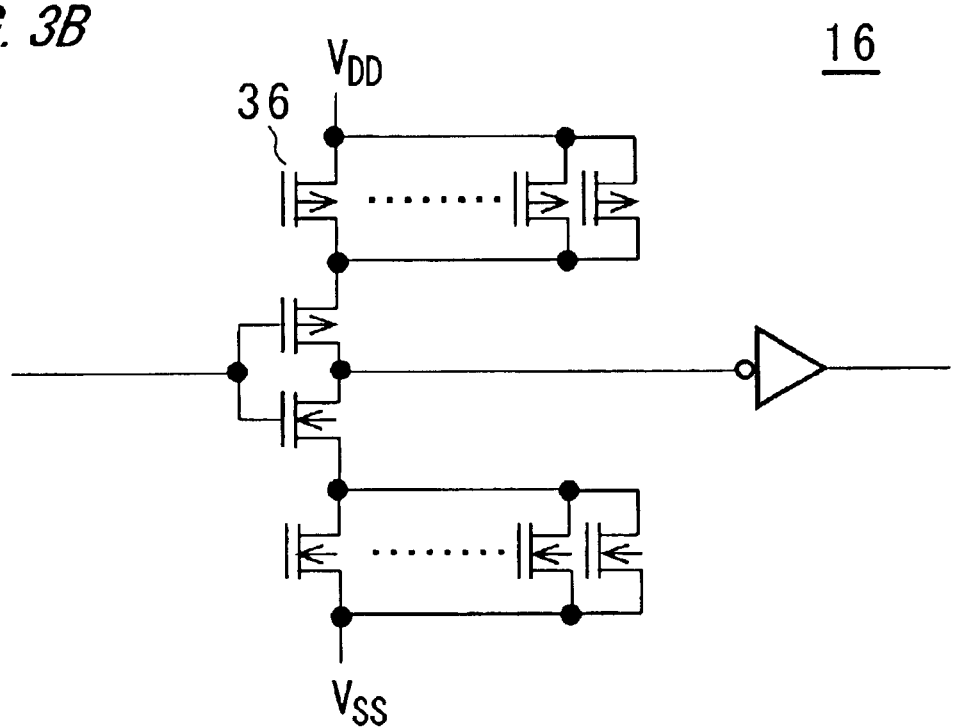
Figure 4A:
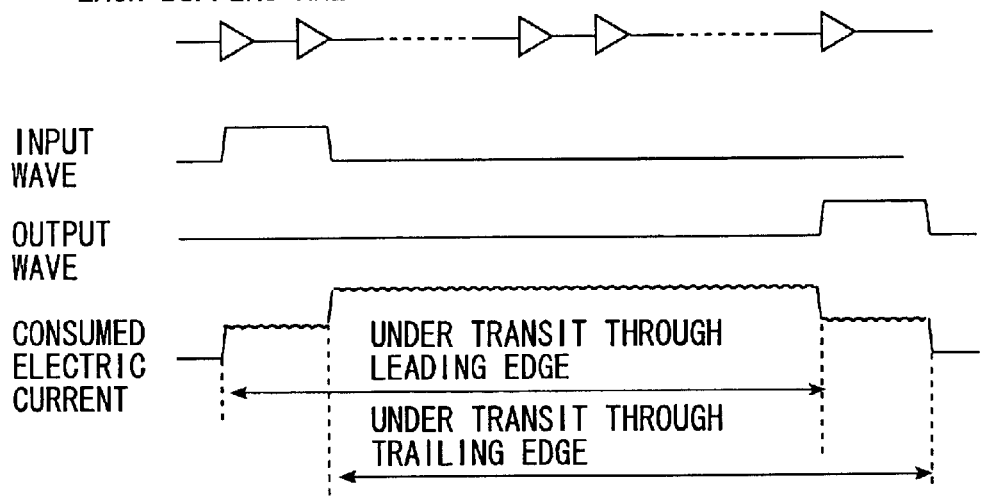
FIGS. 4A and 4B are diagrams for explaining a consumed electric current wave of a circuit to which a plurality of buffers are connected by cascade connection.
Figure 4B:
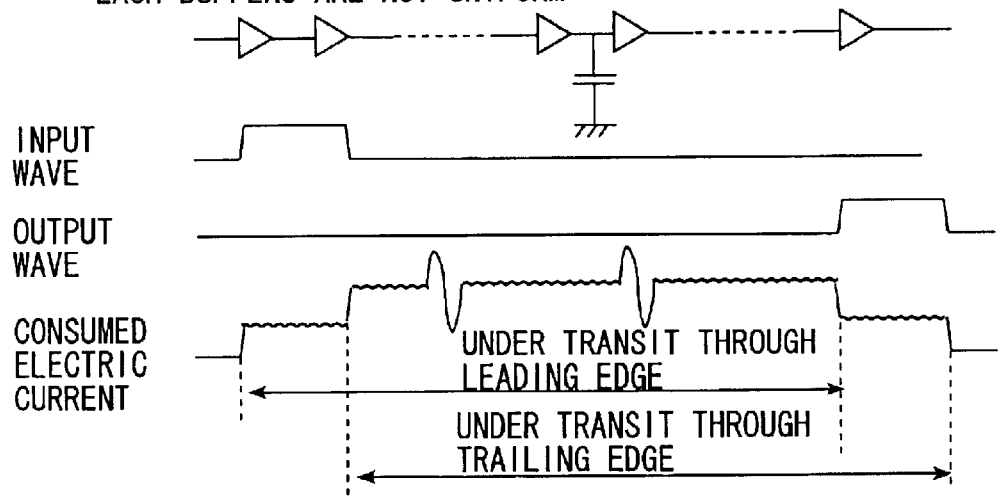
Figure 5:
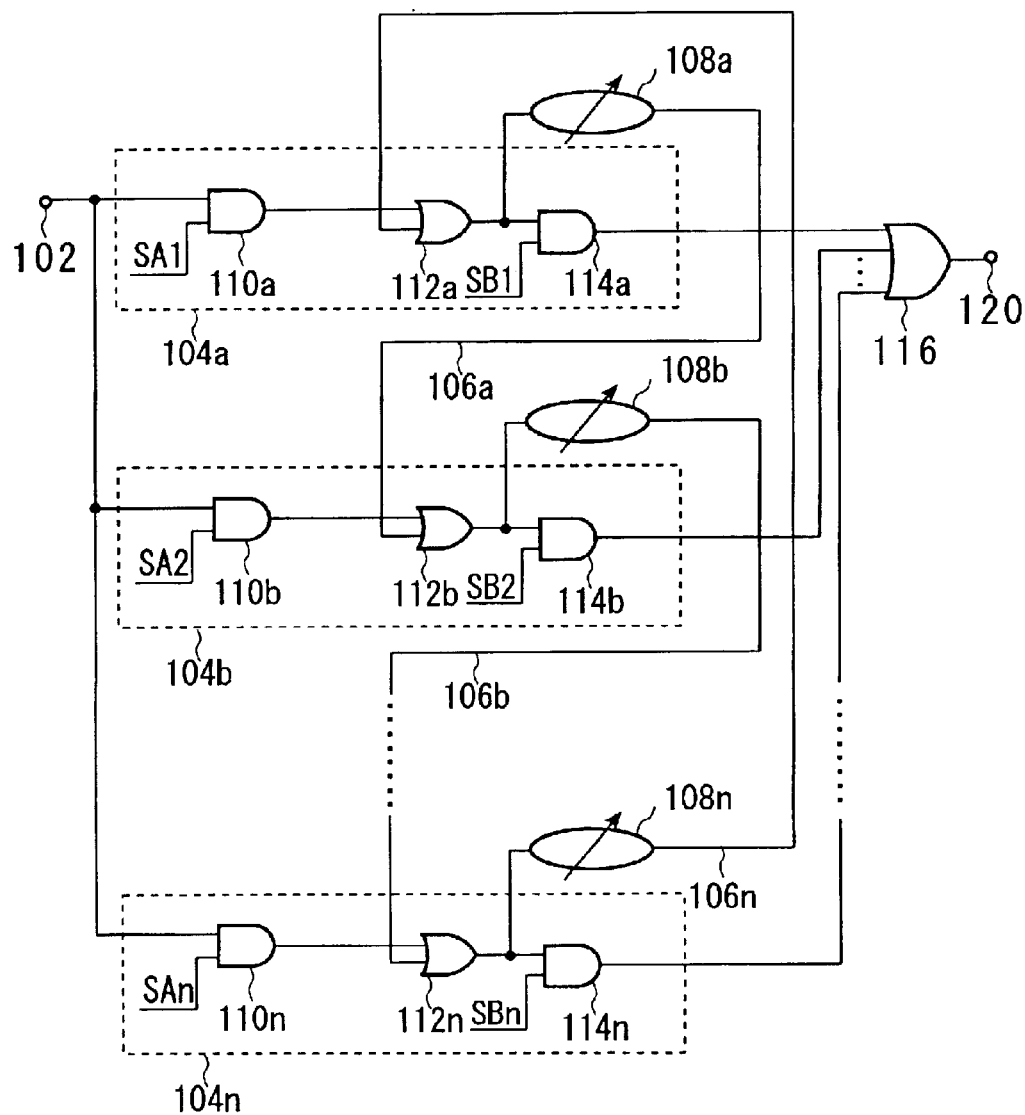
FIG. 5 shows the variable delay circuit 100 which delays an input signal, as a first embodiment of the present invention.

FIG. 5 shows a variable delay circuit 100 which delays an input signal, as a first embodiment of the present invention. The variable delay circuit 100 has predetermined resolution and generates a desired span of variable delay. The variable delay circuit 100 includes an input terminal 102 to which an input signal is supplied, a plurality of delay paths 104, a plurality of connection paths 106, an OR circuit 116 which takes output of the delay paths 104 as inputs and performs logical OR operation on the inputs, and an output terminal 120. The plurality of delay paths 104a–104n are connected in parallel to the input terminal 102. The first delay path 104a has a plurality of delay elements 110a, 112a and 114a. Similarly, the other delay paths 104b–104n have a plurality of delay elements 110b–110n, 112b–112n and 114b–114n, respectively. The OR circuit 116 functions as an output section of the plurality of delay paths 104. In another embodiment, the OR circuit 116 may have another circuit arrangement.

The connection path 106a connects electrically an output of the delay element 112a in the first delay path 104a in the plurality of delay paths 104, and an input of the delay element 112b in the second delay path 104b which is different from the first delay path 104a. In this embodiment, the connection path 106 connects electrically the output of the delay element 112 in at least one of the delay path 104, and the input of the delay element 112 in the other delay path 104 positioned at the following stage of the delay path 104. Moreover, the connection path 106n connects electrically the output of the delay element 112n in the n-th delay paths 104n of the final stage, and the input of the delay element 112a in the first delay path 104a of the first stage. In another embodiment, each of the delay path 104 may connect to a delay path of another stage which is not positioned at the following stage. The connection paths 106a–106n may have variable delay elements 108a–108n, respectively.

In this embodiment, the delay elements 110 and 114 in the delay path 104 may function as a fine delay circuit which generates a short delay span, and the variable delay element 108 may function as a coarse delay circuit which generates a long delay span. For example, the delay elements 110 and 114 may generate a fine delay which has delay resolution of Δt, and the variable delay element 108 may generate a coarse delay which has delay resolution of ΔT. In this embodiment depicted in the drawing, the delay elements 110 and 114 are AND circuits, and the delay span of these AND circuits may be used as a span of a coarse delay. At this time, a fine delay may be generated by adjusting voltage applied to the delay elements 110 and 114, or may be generated by another method. The variable delay element 108 may select one path from a plurality of paths C0–Cn, which have delay resolution of ΔT, and may obtain a desired delay span.

A control signal SA is supplied to the delay element 110, which is an AND circuit, and a control signal SB is supplied to the delay element 114, which is an AND circuit. The control signals SA and SB are supplied to the delay elements 110 and 114 respectively so that a carriage path of a signal may be defined. Moreover, although not shown, it is preferable that circuits, such as AND circuits for example, are positioned in each of connection paths 106a–106n for controlling whether a signal passes the connection paths 106a–106n or not, and a control signal, which defines whether a signal passes or not, is supplied to the circuits.

Figure 6:
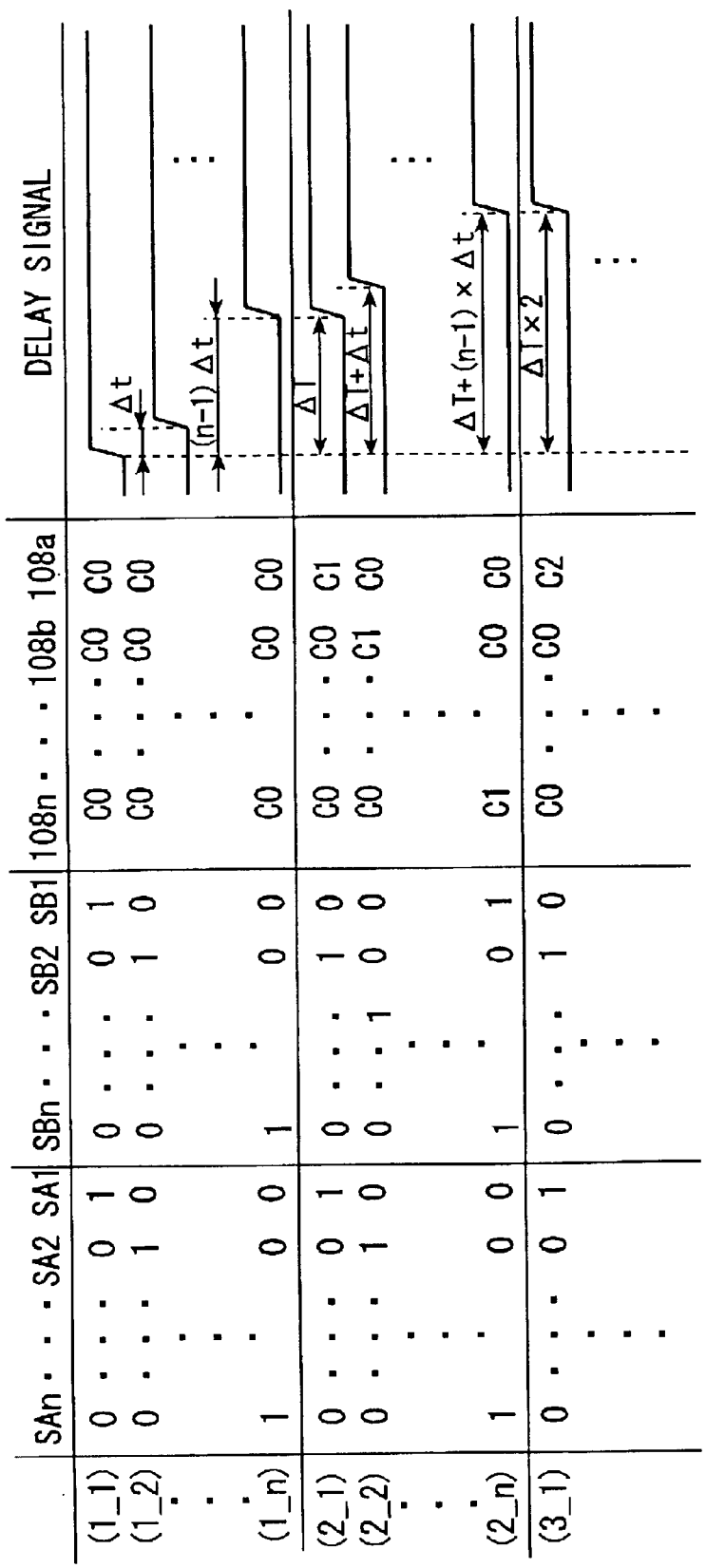
FIG. 6 shows relationship between a logic value of a control signal supplied to each element of the variable delay circuit 100 shown in FIG. 5, and a wave of a delay signal outputted from an output terminal 120.

FIG. 6 shows the relationship between a logic value of control signals supplied to each element of the variable delay circuit 100 shown in FIG. 5, and a wave of a delay signal outputted from the output terminal 120. The delay paths 104 has delay resolution of Δt, and at least a fine delay within a range of {(n−1)·Δt} is generated. Specifically, the second delay path 104b generates a longer delay span than the first delay path 104a by Δt, the n-th delay path 104n generates a longer delay span than the first delay path 104a by (n−1)·Δt. Moreover, the variable delay elements 108a–108n have delay resolution of ΔT. Specifically, the variable delay element 108 has a path C0, which has a delay span of 0, a path C1, which has a delay span of ΔT, and a path C2, which has a delay span of 2ΔT, etc., and either of the paths is selected based on a control signal. It is preferable that the coarse delay span ΔT is shorter than n·Δt.

(1_1) shows a delay signal wave when control signals SA1 and SB1, which have logic values of "1", are supplied to the delay elements 110a and 114a, which are AND circuits, and a delay span of the variable delay element 108 is set at 0 (path C0). The delay signal generated in the conditions of (1_1) is defined as a reference delay signal.

(1_2) shows a delay signal wave when control signals SA2 and SB2, which have logic values of "1", are supplied to the delay elements 100b and 114b, which are AND circuits, and a delay span of the variable delay element. 108 is set at 0 (path C0). The delay signal shown in (1_2) has a longer delay span than the reference delay signal by Δt relatively. (1_n) shows a delay signal wave when control signals SAn and SBn, which have logic values of "1", are supplied to the delay elements 110n and 114n, which are AND circuits, and a delay span of the variable delay element 108 is set at 0 (path C0). The delay signal shown in (1_n) has a longer delay span than the reference delay signal by (n−1)·Δt relatively.

(2_1) shows a delay signal wave when a control signal SA1, which has a logic value of "1", is supplied to the delay element 110a, a control signal SB2, which has a logic value of "1", is supplied to the delay element 114b, and a delay span of the variable delay element 108a is set at ΔT (path C1). At this time, the signal supplied from the input terminal 102 passes the delay elements 110a and 112a, the connection path 106a, in which the variable delay element 108 is included, the delay elements 112b and 114b, and the OR circuit 116, and is outputted from the output terminal 120. The delay signal shown in (2_1) has a longer delay span than the reference delay signal by ΔT relatively. Similarly, the delay signal shown in (2_2) has a longer delay span than the reference delay signal by (ΔT+Δt) relatively, and the delay signal shown in (2_n) has a longer delay span than the reference delay signal by {ΔT+(n−1)·Δt} relatively.

(3_1) shows a delay signal wave when a control signal SA1, which has a logic value of "1", is supplied to the delay element 110a, a control signal SB2, which has a logic value of "1", is supplied to the delay element 114b, and a delay span of the variable delay element 108 is set at 2ΔT (path C2). The delay signal shown in (3_1) has a longer delay span than the reference delay signal by 2ΔT relatively.

In this manner, the variable delay circuit 100 generates a delay which has delay resolution of Δt. Although FIG. 6 explained how to generate the desired delay span using the two adjacent delay paths 104 (104a, 104b) as shown in (2_1) for example, the desired delay span may be generated using a plurality of delay paths which do not adjoin each other in another embodiment. For example, the desired delay span may be generated using the delay path 104b, the delay path 104n which does not adjoin the delay path 104b, and the connection path 106 which exists between the delay path 104b and the delay path 104n.

The variable delay circuit 100 in this embodiment may have a smaller circuit scale than a conventional circuit by integrating the variable delay element 108 as a coarse delay circuit, and the delay path 104 as a fine delay circuit by the connection path 106.

Figure 7:
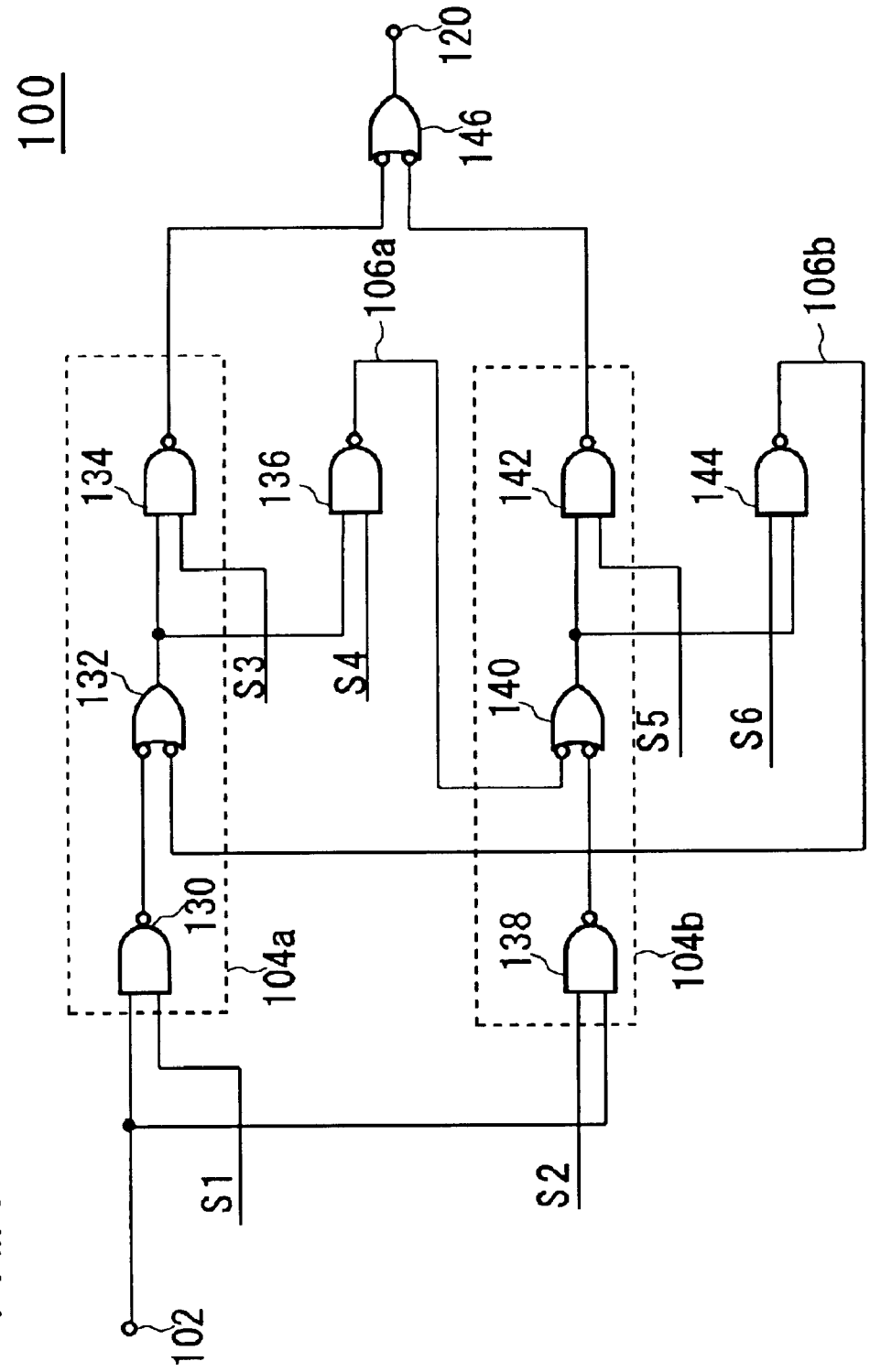
FIG. 7 shows the variable delay circuit 100 which delays an input signal, as a second embodiment of the present invention.

FIG. 7 shows the variable delay circuit 100 which delays an input signal, as a second embodiment of the present invention. The variable delay circuit 100 has a predetermined delay resolution and generates a desired variable delay span. The variable delay circuit 100 includes an input terminal 102 to which an input signal is supplied, a plurality of delay paths 104a and 104b, a plurality of connection paths 106a and 106b, a NAND circuit 146 which takes output of the delay paths 104a and 104b and performs logical NAND operation, and an output terminal 120. The plurality of delay paths 104a and 104b are connected in parallel to the input terminal 102. A first delay path 104a has a plurality of delay elements 130, 132, and 134. Similarly, a second delay path 104b also has a plurality of delay elements 138, 140, and 142. The NAND circuit 146 functions as an output section of the plurality of delay paths 104. In another embodiment, the NAND circuit 146 may be other logic gate circuit.

The connection path 106a connects electrically the output of the delay element 132 in the first delay path 104a, and the input of the delay element 140 in the second delay path 104b, in the plurality of delay paths 104. Moreover, the connection path 106b connects electrically the output of the delay element 140 in the second delay path 104b, and the input of the delay element 132 in the first delay path 104a. In this embodiment, the connection path 106a has a delay element 136, and the connection path 106b has a delay element 144. In the variable delay circuit 100 in this embodiment, it is preferable that all the delay elements are NAND circuits, each of which has at least two inputs, a first input and a second input. In another embodiment, the connection path 106 may be a path which does not have a delay element.

In this embodiment, each delay element functions as fine delay circuit in which a short span of fine delay is generated. Moreover, a plural stages of delay elements function as a coarse delay circuit which generates the long span of coarse delay. Moreover, coarse delay resolution may be generated by selecting whether a carriage path of a signal includes the connection paths 106a or 106b or not. The delay elements 136 and 140 are NAND circuits, and coarse delay resolution of the variable delay circuit 100 is as much as delay resolution of the two NAND circuits.

Figure 8A:
FIGS. 8A and 8B are diagrams for explaining a principle of a two-input NAND circuit generating a short span of fine delay.
Figure 8B:
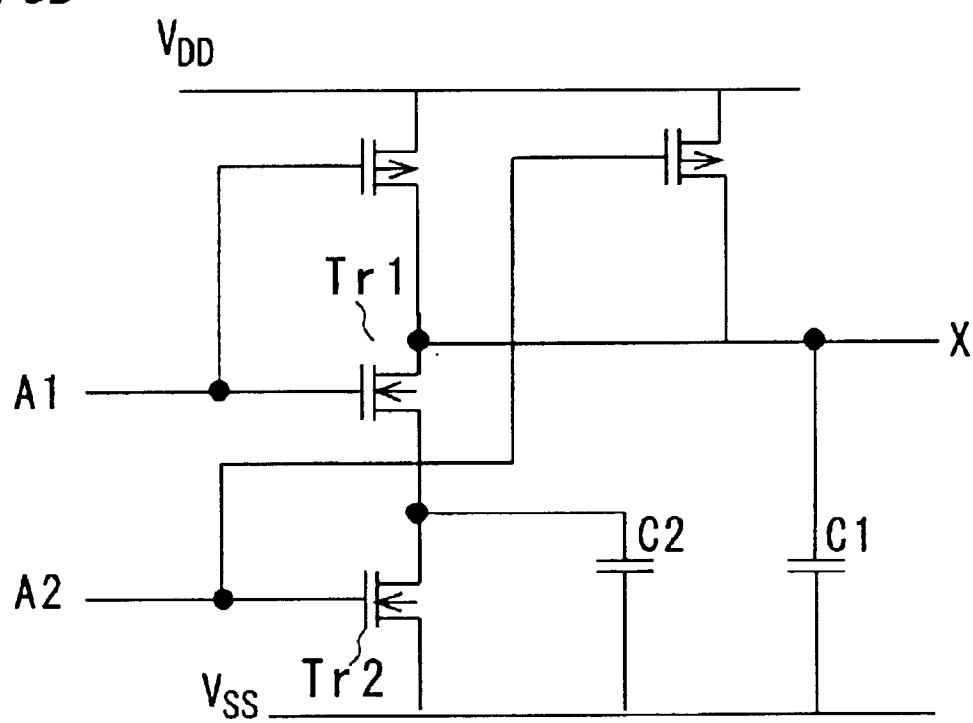

FIG. 8 is a diagram for explaining a principle of a two-input NAND circuit generating a short span of fine delay. FIG. 8A shows a logic symbol of the two-input NAND circuit which has a first input A1, a second input A2, and an output X. FIG. 8B shows a circuit diagram of the NAND circuit shown in FIG. 8A. The NAND circuit has a parasitic capacitor C1 at the output, and has a parasitic capacitor C2 between the first input A1 and the second input A2 as it is shown. The reason will be explained hereinafter why a delay span of a signal from the output X, when a signal is supplied to the first input A1, is different from a delay span of a signal from the output X, when a signal is supplied to the second input A2 due to the parasitic capacitor C2.

First, when a logic level H is supplied to the second input A2, and a pulse signal is supplied to the first input A1, since a gate of a transistor Tr2 is always turned on at this time, the parasitic capacitor C2 is discharged. When a pulse signal is supplied to a transistor Tr1 in this condition, the delay span of an output signal outputted from the output X is hardly influenced by the parasitic capacitor C2.

Next, when a logic level H is supplied to the first input A1, and a pulse signal is supplied to the second input A2, although the gate of the transistor Tr1 is turned on at this time, since the gate of the transistor Tr2 is turned off, the parasitic capacitor C2 is charged. When a pulse signal is supplied to the gate of the transistor Tr2 and the transistor Tr2 turns on in this condition, since it will take a little time for discharging the parasitic capacitor C2, the output signal from the output X is slightly delayed for the duration of the discharge. That is, when a rise pulse is supplied to the transistor Tr2, a fall time of an output signal is lengthened, so that a delay of the output signal is generated. Thus, a short delay may be generated when a signal is supplied to the second input A2, compared with the case when a signal is supplied to the first input A1.

The variable delay circuit 100 shown in FIG. 7 may utilize the first input or the second input of each delay element as an input terminal of a signal, and may generate a short span of fine delay by adjusting the number of the first input and the second input connected to a signal path. Therefore, the delay paths 104a and 104b in this embodiment have the NAND circuits which sets either the first input or the second input as a signal input based on a desired delay span which should delay an input signal. Moreover, the connection paths 106a and 106b also have the NAND circuits which sets either the first input or the second input as a signal input based on a desired delay span which should delay an input signal. Accordingly, it is preferable that which input, the first input or the second input of the NAND circuit, is to be selected as an input terminal, is set based on a desired delay span or fine delay resolution.

FIG. 9 is a diagram for explaining the relationship between control signals S1–S6 supplied to each delay element, and a delay span of an output signal in the variable delay circuit 100 shown in FIG. 7. As explained in reference to FIG. 8, between two inputs of a NAND circuit, the input shown on an upper side of the drawing is defined as the first input A1 and the input shown on a lower side of the drawing is defined as the second input A2. When a signal is supplied to the second input A2, an output signal is delayed a little bit more than the case where a signal is supplied to the first input A1. In a NAND circuit, a delay span, equivalent to the difference between a delay span of a signal supplied to the first input A1 and a delay span of a signal supplied to the second input A2, is defined as $\Delta t$.

(1) shows a delay span at the time of supplying control signals S1 and S3, each of which has logic value of "1", to the delay elements 130 and 134 respectively. The input signal supplied from the input terminal 102 passes the delay elements 130, 132, 134, and 146, and is outputted from the output terminal 120. Therefore, in the path of (1), the output signal has a coarse delay span of four stages of NAND circuits. The signal is supplied to the first input A1 of each of delay elements 130, 132, 134, and 146 as shown in FIG. 7.

(2) shows a delay span at the time of supplying control signals S2 and S5, each of which has logic value of "1", to the delay elements 138 and 142 respectively. The input signal passes the delay elements 138, 140, 142, and 146, and is outputted from the output terminal 120. Therefore, in the path of (2), the output signal has a coarse delay span of four stages of NAND circuits. The signal is supplied to the first input A1 of delay element 142, and supplied to the second input A2 of delay elements 138, 140 and 146 as shown in FIG. 7.

When (2) is compared with (1), although the number of stages of the NAND circuits (a coarse delay span) through which the signal passes are the same, the number of times for the signal being supplied to the second input A2 is different. In this example, the signal passes through the second inputs A2 three times on the carriage path of the control signal shown in (2), while the signal does not pass through the second input A2 on the carriage path of the control signal shown in (1). Therefore, the output signal in (2) is delayed more than the output signal in (1) by $3\Delta t$.

(3) shows a delay span at the time of supplying control signals S1, S4 and S5, each of which has logic value of "1", to the delay elements 130, 136 and 142 respectively. The input signal passes the delay elements 130, 132, 136, 140, 142 and 146, and is outputted from the output terminal 120. Therefore, in the path of (3), the output signal has a coarse delay span of six stages of NAND circuits. When (3) is compared with (1) or (2), the coarse delay span of the path of (3) is longer than the coarse delay span of the path of (1) or (2) by the delay span of two stages of the NAND circuits. Accordingly, the variable delay circuit 100 in this embodiment has coarse delay resolution equivalent to two stages of NAND circuits. As shown in FIG. 7, a signal is supplied to the first input A1 of delay elements 130, 132, 136, 140, and 142, and is supplied to the second input A2 of a delay element 146.

(4) shows a delay span at the time of supplying control signals S2, S3 and S6, each of which has logic value of "1", to the delay elements 138, 134 and 144 respectively. The input signal passes the delay elements 138, 140, 144, 132, 134 and 146, and is outputted from the output terminal 120. Therefore, in the path of (4), the output signal has a coarse delay span of six stages of NAND circuits. As shown in FIG. 7, a signal is supplied to the first input A1 of delay elements 134 and 146, and is supplied to the second input A2 of delay elements 138, 140, 144 and 132.

When (4) is compared with (3), although the numbers of stages of the NAND circuits (a coarse delay span) through which the signal passes are the same, the number of times for the signal being supplied to the second input A2 is different. In this example, the signal passes through the second inputs A2 four times on the carriage path of the control signal shown in (4), while the signal passes through the second input A2 only once on the carriage path of the control signal shown in (3). Therefore, the output signal in (4) is delayed more than the output signal in (3) by 3Δt.

Accordingly, the variable delay circuit 100 in this embodiment has coarse delay resolution equivalent to two stages of NAND circuits and fine delay resolution of 3Δt. In another embodiment, coarse delay resolution and fine delay resolution, which are different from this embodiment, may be applicable by adjusting the number and a configuration of the NAND circuit, and adjusting selection of two inputs to each of the NAND circuit.

Figure 10:
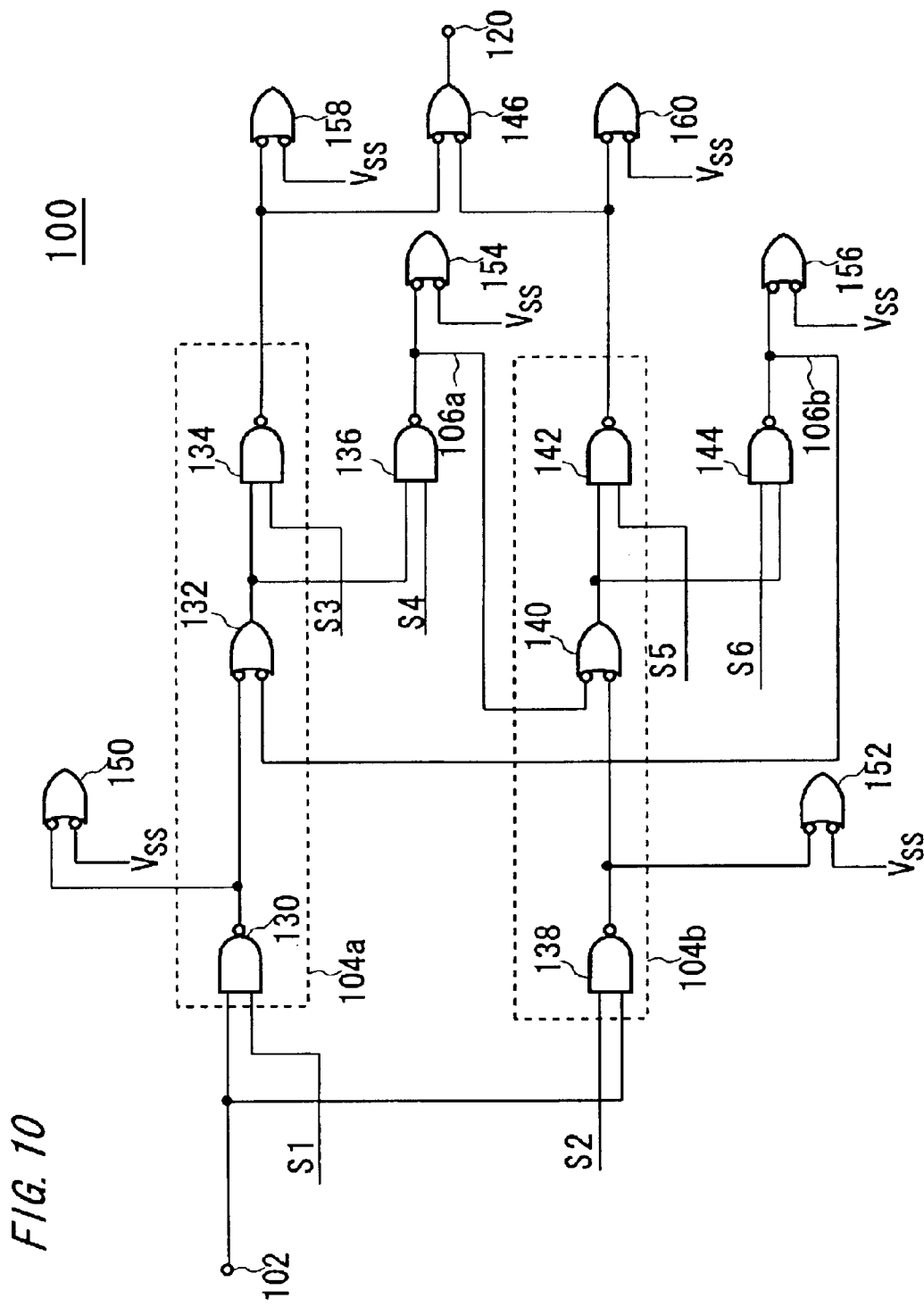
FIG. 10 shows the variable delay circuit 100 which delays an input signal, as a third embodiment of the present invention.

FIG. 10 shows the variable delay circuit 100 which delays an input signal, as a third embodiment of the present invention. The variable delay circuit 100 has a predetermined resolution and generates a desired variable delay. In addition to the configuration of the variable delay circuit 100 in the second embodiment explained in reference to FIG. 7, the variable delay circuit 100 in the third embodiment includes a plurality of additional elements 150, 152, 154, 156, 158 and 160. In FIG. 10, the composition which bears the same symbol as the symbol in FIG. 7 is the same as, or has the same function as, the composition shown and explained in FIG. 7.

For example, an output of the delay element 132 is connected to inputs of the delay elements 134 and 136, and also an output of the delay element 140 is connected to inputs of delay elements 142 and 144. It is preferable that the additional elements 150, 152, 154, 156, 158, and 160, are positioned at inputs of predetermined delay elements so that input loads of the delay elements may be substantially equalized. Specifically, the additional element 150 is positioned at an input of the delay element 132, and an output of the delay element 130 is connected to inputs of the delay element 132 and the additional element 150. Therefore, the delay element 132 shares the additional element 150 and the output of the delay element 130. Consequently, the input loads of the delay element 132 and the delay element 134 are equalized substantially. Similarly, each of the other additional elements 152, 154, 156, 158, and 160 is positioned at input of predetermined delay element, and output of each of the delay element is connected to inputs of two delay elements (or a delay element and an additional element). It is preferable that an additional element has the same circuit configuration as a delay element. In this embodiment, all delay elements and all additional elements are NAND circuits. By equalizing the input loads of all delay elements, the wave of consumed electric current becomes flat and it becomes possible to eliminate a noise of supply current supplied to each delay element. Therefore, the variable delay circuit 100 in this embodiment reduces a fluctuation of a delay span caused by a fluctuation of supply current.

In this embodiment, although one additional element is positioned at the input of the predetermined delay element in order to equalize the input loads of the delay elements, a plurality of additional elements may be positioned in another embodiment. Further in another embodiment, based on the maximum number of delay elements to be connected to an output of each delay element, additional elements may be positioned at an output of a delay element where the number of connected delay element are fewer than the maximum number.

Figure 11:
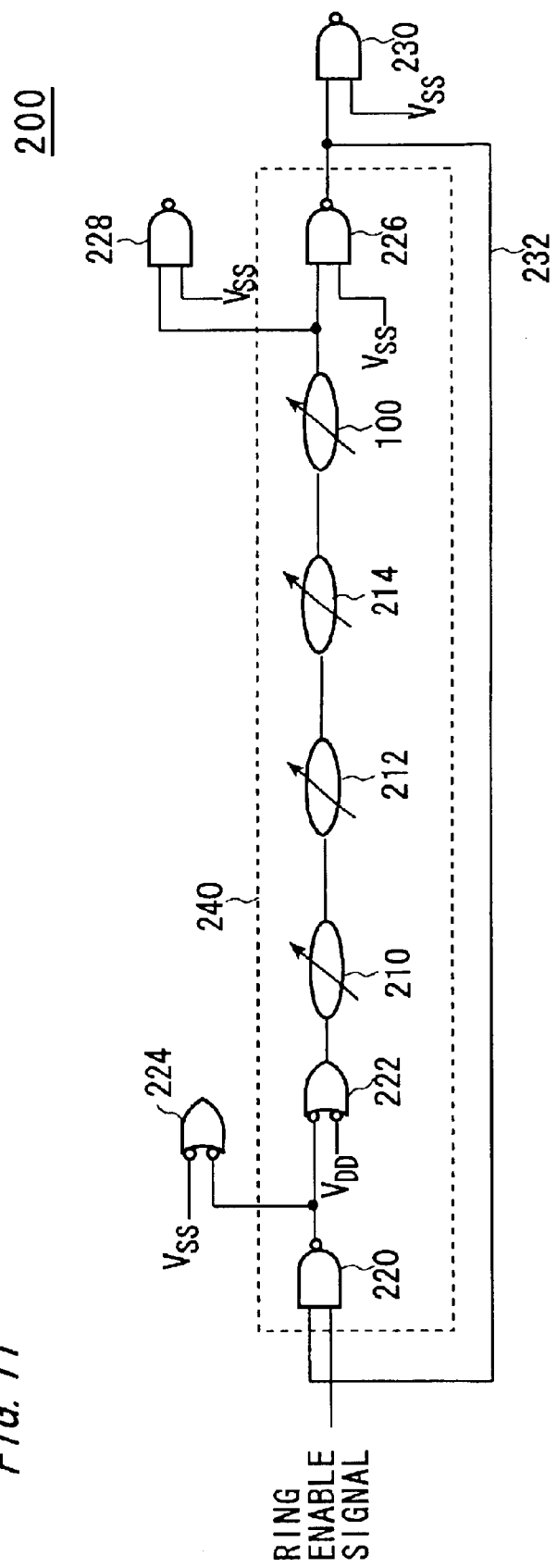
FIG. 11 shows a ring oscillator 200 which varies an oscillation frequency, as a fourth embodiment of the present invention.

FIG. 11 shows a ring oscillator 200 which varies an oscillation frequency, as a fourth embodiment of the present invention. The ring oscillator 200 includes the variable delay circuit 100 explained with respect to the first, the second and the third embodiments of this invention. Moreover, the ring oscillator 200 includes variable delay circuits 210, 212, and 214, a feedback line 232, and a plurality of NAND circuits 220, 222, 224, 226, 228, and 230. The NAND circuits 220, 222, and 226 have a function as delay elements which delay a supplied signal. As it is shown in the drawing, the NAND circuits 220, 222, and 226 and the variable delay circuits 210, 212, 214, and 100 constitute a delay path 240 which delays an input signal. The feedback line 232 returns an output of the delay path 240 to an input of the delay path 240. In FIG. 11, the NAND circuits 224 and 228 function as additional elements which equalize input loads of delay elements explained in the third embodiment. It is preferable that the additional elements have the same composition as the delay element. In this example, the NAND circuit 224 is positioned at an input of the NAND circuit 222, and the NAND circuit 228 is similarly positioned at an input of the NAND circuit 226. In the ring oscillator 200 in this embodiment, it is preferable that an output of one delay element is shared by two delay elements. Specifically, it is preferable that, in the interior of the delay path 240, all the delay elements are NAND circuits and input loads of the delay elements are substantially equalized.

Figure 12:
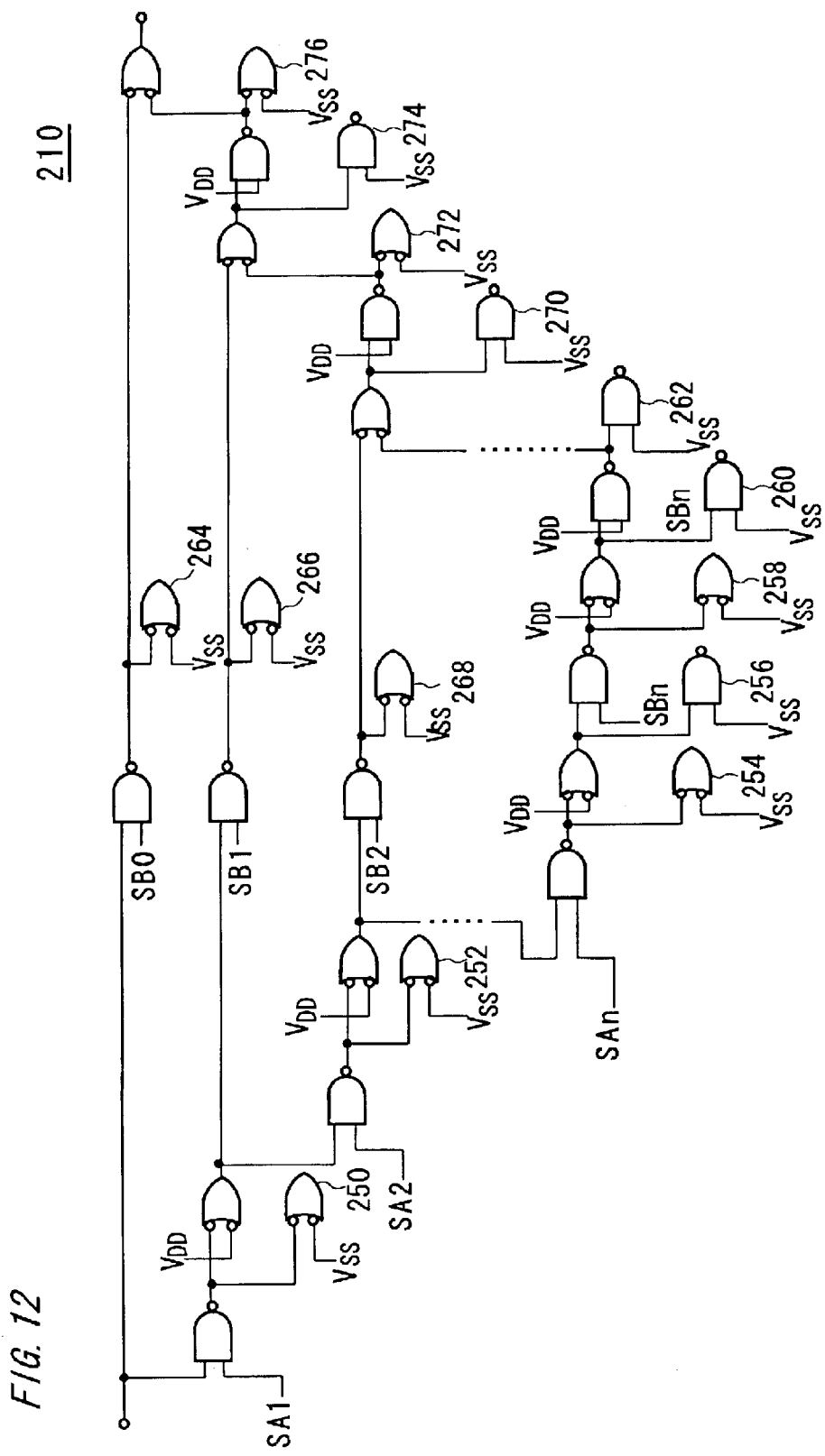
FIG. 12 shows an example of a variable delay circuit 210 shown in FIG. 11.

FIG. 12 shows an example of a variable delay circuit 210 shown in FIG. 11. The variable delay circuit 210 has a plurality of delay elements which constitute (n+1) stages of delay paths. Moreover, the variable delay circuit 210 has additional elements positioned at an input of the delay elements so that input loads of delay elements in delay paths are substantially equalized. Specifically, the variable delay circuit 210 has additional elements 250, 252, 254, 256, 258, 260, 262, 264, 266, 268, 270, 272, 274 and 276. A supply current is flattened by positioning additional element at input of predetermined delay element. Therefore, the variable delay circuit 210 generates a accurate delay span, and the ring oscillator 200 outputs a signal which has an accurate oscillation frequency.

FIG. 13 shows a relationship between a combination of control signals SA1–SAn and SB0–SBn which select the delay path in the variable delay circuit 210 shown in FIG. 12, and a delay span of a selected delay path. The variable delay circuit 210 functions as a coarse delay circuit which generates a long delay span in the ring oscillator 200, and a variable delay span, which has resolution equivalent to four stages of NAND circuits, is generated in this embodiment.

Figure 14:
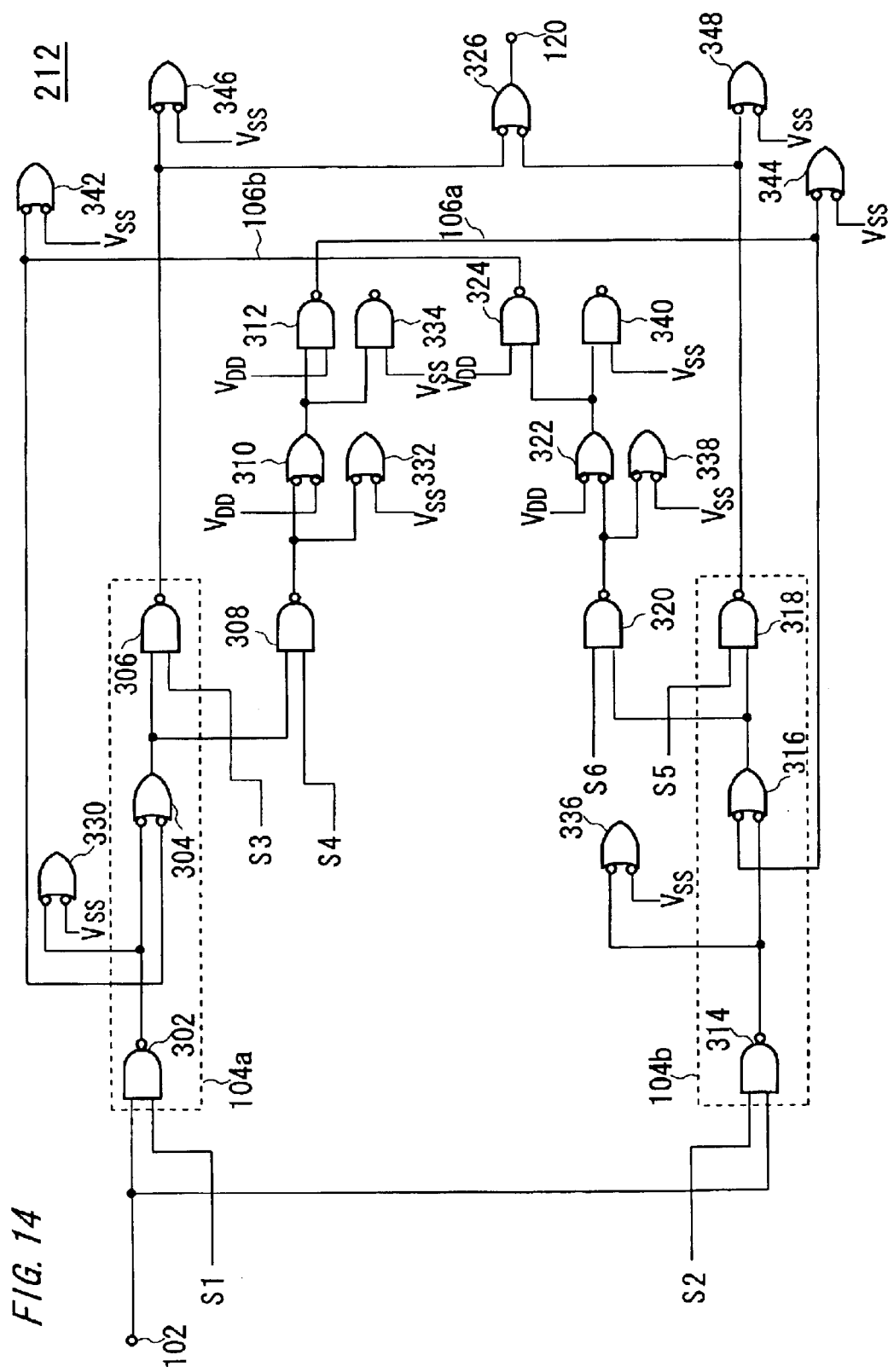
FIG. 14 shows one embodiment of a variable delay circuit 212 shown in FIG. 11.

FIG. 14 shows one embodiment of a variable delay circuit 212 shown in FIG. 11. The variable delay circuit 214 shown in FIG. 11 may have the same configuration as the variable delay circuit 212. The variable delay circuit 212 has predetermined delay resolution and generates a desired variable delay. The variable delay circuit 212 includes an input terminal 102 to which an input signal is supplied, a plurality of delay paths 104a and 104b, a plurality of connection paths 106a and 106b, a NAND circuit 326 which takes output of the delay paths 104a and 104b and performs logical NAND operation, and an output terminal 120. The plurality of delay paths 104a and 104b are connected in parallel to the input terminal 102. The first delay path 104a has a plurality of delay elements 302, 304, and 306. Similarly, the second delay path 104b also has a plurality of delay elements 314, 316, and 318. The NAND circuit 326 functions as an output section of the plurality of delay paths 104. In another embodiment, the NAND circuit 326 may have another circuit arrangement.

The connection path 106a connects electrically an output of the delay element 304 in the first delay path 104a, and an input of the delay element 316 in the second delay path 104b. Moreover, the connection path 106b connects electrically an output of the delay element 316 in the second delay path 104b, and an input of the delay element 304 in the first delay path 104a. In this embodiment, the connection path 106a has delay elements 308, 310, and 312, and the connection path 106b has delay elements 320, 322, and 324. In the variable delay circuit 212 in this embodiment, it is preferable that all the delay elements are NAND circuits, each of which has at least two inputs, a first input and a second input. In another embodiment, the connection path 106 may be a path which does not include a delay element.

The variable delay circuit 212 may utilize either of the first input or the second input of each delay element as an input terminal of a signal, and may generate a short span of fine delay by adjusting the number of the first input and the second input connected to a signal path. Therefore, it is preferable that the delay paths 104a and 104b in this embodiment have the NAND circuits which sets either the first input or the second input as a signal input based on a desired delay span which should delay an input signal. Accordingly, it is preferable that which input, the first input or the second input of the NAND circuit, is to be selected as an input terminal, is set based on a desired delay span or fine delay resolution.

FIG. 15 is a diagram for explaining the relationship between control signals S1–S6 supplied to each delay element, and a delay span of an output signal in the variable delay circuit 212 shown in FIG. 14. As explained in reference to FIG. 8, between two inputs of a NAND circuit, the input shown on an upper side of the drawing is defined as the first input A1 and the input shown on a lower side of the drawing is defined as the second input A2. When a signal is supplied to the second input A2, an output signal is delayed a little bit more than the case where a signal is supplied to the first input A1. In a NAND circuit, a delay span, equivalent to the difference between a delay span of a signal supplied to the first input A1 and a delay span of a signal supplied to the second input A2, is defined as Δt.

(1) shows a delay span at the time of supplying control signals S1 and S3, each of which has logic value of "1", to the delay elements 302 and 306 respectively. The input signal supplied from the input terminal 102 passes the delay elements 302, 304, 306 and 326, and is outputted from the output terminal 120. Therefore, in the path of (1), the output signal has a coarse delay span of four stages of NAND circuits. The signal is supplied to the first input A1 of each of delay elements 302, 304, 306 and 326 as shown in FIG. 14.

(2) shows a delay span at the time of supplying control signals S2 and S5, each of which has logic value of "1", to the delay elements 314 and 318 respectively. The input signal passes the delay elements 314, 316, 318 and 326, and is outputted from the output terminal 120. Therefore, in the path of (2), the output signal has a coarse delay span of four stages of NAND circuits. The signal is supplied to the second input A2 of delay elements 314, 316, 318 and 326 as shown in FIG. 14.

When (2) is compared with (1), although the number of stages of the NAND circuits (a coarse delay span) through which the signal passes are the same, the number of times for the signal being supplied to the second input A2 is different. In this example, the signal passes through the second inputs A2 four times on the carriage path of the control signal shown in (2), while the signal does not pass through the second input A2 on the carriage path of the control signal shown in (1). Therefore, the output signal in (2) is delayed more than the output signal in (1) by 4Δt.

(3) shows a delay span at the time of supplying control signals S1, S4 and S5, each of which has logic value of "1", to the delay elements 302, 308 and 318 respectively. The input signal passes the delay elements 302, 304, 308, 310, 312, 316, 318 and 326, and is outputted from the output terminal 120. Therefore, in the path of (3), the output signal has a coarse delay span of eight stages of NAND circuits. When (3) is compared with (1) or (2), the coarse delay span of the path of (3) is longer than the coarse delay span of the path of (1) or (2) by the delay span of four stages of the NAND circuits. Accordingly, the variable delay circuit 212 in this embodiment has coarse delay resolution equivalent to four stages of NAND circuits. As shown in FIG. 14, a signal is supplied to the first input A1 of delay elements 302, 304, 308, 310, 312 and 316, and is supplied to the second input A2 of delay elements 318 and 326.

(4) shows a delay span at the time of supplying control signals S2, S3 and S6, each of which has logic value of "1", to the delay elements 314, 306 and 320 respectively. The input signal passes the delay elements 314, 316, 320, 322, 324, 304, 306 and 326, and is outputted from the output terminal 120. Therefore, in the path of (4), the output signal has a coarse delay span of eight stages of NAND circuits. As shown in FIG. 14, a signal is supplied to the first input A1 of delay elements 306 and 326, and is supplied to the second input A2 of delay elements 314, 316, 320, 322, 324 and 304.

When (4) is compared with (3), although the numbers of stages of the NAND circuits (a coarse delay span) through which the signal passes are the same, the number of times for the signal being supplied to the second input A2 is different. In this example, the signal passes through the second inputs A2 six times on the carriage path of the control signal shown in (4), while the signal passes through the second input A2 only twice on the carriage path of the control signal shown in (3). Therefore, the output signal in (4) is delayed more than the output signal in (3) by 4Δt.

Accordingly, the variable delay circuit 212 in this embodiment has coarse delay resolution equivalent to four stages of NAND circuits and fine delay resolution of 4Δt. In another embodiment, coarse delay resolution and fine delay resolution, which are different from this embodiment, may be applicable by adjusting the number and a configuration of the NAND circuit, and adjusting selection of two inputs to each of the NAND circuit.

From the foregoing explanation, according to this invention, there is provided a delay circuit which generates a accurate delay span. Although the present invention has been described by way of exemplary embodiment, the scope of the present invention is not limited to the foregoing embodiment. Various modifications in the foregoing embodiment may be made when the present invention defined in the appended claims is enforced. It is obvious from the definition of the appended claims that embodiments with such modifications also belong to the scope of the present invention.

What is claimed is:

1. A delay circuit which delays an input signal, comprising:

an input terminal to which the input signal is supplied;

a plurality of delay paths comprising a plurality of delay elements, said delay paths comprising a first delay path and a second delay path and connecting in parallel to said input terminal; and a first connection path which connects electrically an output of a delay element on said first delay path to an input of a delay element on said second delay path, said first connection path including a delay element arranged to delay an output timing of the input signal longer than an output timing delayed through the plurality of delay elements of said first delay path and said second delay path.

2. The delay circuit as claimed in claim 1, further comprising a third connection path which connects electrically an output of said delay element on said second delay path to an input of said delay element on said first delay path.

3. The delay circuit as claimed in claim 1, further comprising:

at least one third connection path which connects electrically an output of said delay element of at least one of said plurality of delay paths to an input of said delay element of another delay path following said delay path; and a fourth connection path which connects electrically an output of said delay element on a delay path of a final stage to an input of said delay element on a delay path of a first stage.

4. The delay circuit as claimed in claim 1, wherein said delay element comprises a logic gate circuit including at least two inputs, a first input and a second input.

5. The delay circuit as claimed in claim 4, wherein said logic gate circuit on the delay path makes either the first input or the second input to be an input to said logic gate circuit based on a desired delay span which delays the input signal.

6. The delay circuit as claimed in claim 1, further comprising an additional element positioned at an input of the predetermined delay element so that input loads of the delay elements are substantially equalized.

7. The delay circuit as claimed in claim 6, wherein said additional element is the same element as said delay element.

8. The delay circuit as claimed in claim 1, wherein at least one of said connection paths comprises a delay element.

9. A delay circuit which delays an input signal, comprising:

an input terminal to which the input signal is supplied;

a delay path which comprises a first delay element having an input terminal connected to said input terminal and a second delay element having an input terminal connected to an output terminal of said first delay element; and an additional element having an input terminal connected to said output terminal of said first delay element so that input loads of said first and second delay elements in said delay path are substantially equalized.

10. The delay circuit as claimed in claim 9, wherein the additional element is the same element as the delay element.

11. The delay circuit as claimed in claim 10, comprising:

a plurality of said delay paths connected in parallel to said input terminal; and a connection path which connects electrically an output of a first delay element in a first delay path in said plurality of said delay paths, and an input of a second delay element in a second delay path which is different from the first delay path, wherein an output of a third delay element, positioned at previous stage of the first delay element in the first delay path, is connected an input of the first delay element and an input of the additional element.

12. The delay circuit as claimed in claim 11, further comprising a connection path which connects electrically an output of the second delay element in the second delay path, and an put of the first delay element in the first delay path.

13. A ring oscillator which varies an oscillation frequency, comprising:

a delay path which comprises a first delay element having an input terminal connected to said input terminal and a second delay element having an input terminal connected to an output terminal of said first delay element;

a feedback line which returns an output of said delay path to an input of said delay path; and an additional element having an input terminal connected to said output terminal of said first delay element so that input loads of said first and second delay elements in said delay path are substantially equalized.

14. The ring oscillator as claimed in claim 13, wherein the additional element is the same element as the delay element.

15. The ring oscillator as claimed in claim 14 wherein, said delay path comprises:

a variable delay circuit, a fourth delay element, among the plurality of delay elements, an input of said fourth delay element being connected to said variable delay circuit, and an output of said fourth delay element being connected to said feedback line, wherein an output of said variable delay circuit is connected to an input of said fourth delay element and an input of said additional element.

16. The ring oscillator as claimed in claim 15 wherein, said delay path comprises:

a fifth delay element, among the plurality of delay elements, an output of said fifth delay element being connected electrically to said variable delay circuit, and an input of said fifth delay element being connected to said feedback line; and a sixth delay element positioned at previous stage of said fifth delay element; and further comprises:

an additional element positioned at an input of said fifth delay element, wherein an output of said sixth delay element is connected to an input of said additional element, positioned at an input of said fifth delay element, and an input of said fifth delay element.

17. The ring oscillator as claimed in claim 13, comprising a plurality of said delay paths connected in parallel, and comprising a connection path which connects electrically an output of said delay element in a first delay path in a plurality of said delay paths, and an input of said delay element in a second delay path which is different from the first delay path.

* * * * *